(12) United States Patent
Yang

(10) Patent No.: US 8,395,252 B1
(45) Date of Patent: Mar. 12, 2013

(54) INTEGRATED MEMS AND CMOS PACKAGE AND METHOD

(75) Inventor: Xiao "Charles" Yang, Cupertino, CA (US)

(73) Assignee: mCube Inc., San Jose, CA (US)

( * ) Notice: Subject to any disclaimer, the term of this patent is extended or adjusted under 35 U.S.C. 154(b) by 0 days.

(21) Appl. No.: 12/945,087

(22) Filed: Nov. 12, 2010

Related U.S. Application Data

(60) Provisional application No. 61/260,847, filed on Nov. 13, 2009.

(51) Int. Cl.
*H01L 23/02* (2006.01)

(52) U.S. Cl. .......... 257/687; 257/288; 257/69; 257/678; 257/E21.421; 257/E21.499; 257/E21.502; 257/E21.509; 257/E21.613; 257/E21.614; 257/E21.632

(58) Field of Classification Search .............. 257/69, 257/288, 350, 401, 678, 682, 687, 676, E21.421, 257/E21.499, E21.502, 509, 613, 614, 632
See application file for complete search history.

(56) References Cited

U.S. PATENT DOCUMENTS

| | | | |
|---|---|---|---|
| 3,614,677 A | 10/1971 | Wilfinger | |
| 5,140,745 A | 8/1992 | McKenzie | |
| 5,493,769 A | 2/1996 | Sakai et al. | |
| 6,046,409 A | 4/2000 | Ishii et al. | |
| 6,188,322 B1* | 2/2001 | Yao et al. | 340/664 |
| 6,278,178 B1 | 8/2001 | Kwon et al. | |
| 6,534,726 B1 | 3/2003 | Okada et al. | |
| 6,855,572 B2 | 2/2005 | Jeung et al. | |
| 6,979,872 B2* | 12/2005 | Borwick et al. | 257/415 |
| 7,183,630 B1 | 2/2007 | Fogelson et al. | |
| 7,195,945 B1 | 3/2007 | Edelstein et al. | |
| 7,511,379 B1 | 3/2009 | Flint | |
| 7,713,785 B1 | 5/2010 | Flint | |
| 8,165,323 B2 | 4/2012 | Zhou | |
| 2001/0053565 A1 | 12/2001 | Khoury | |
| 2004/0016995 A1* | 1/2004 | Kuo et al. | 257/678 |
| 2004/0227201 A1 | 11/2004 | Borwick, III et al. | |
| 2005/0252293 A1 | 11/2005 | Wong et al. | |
| 2006/0141786 A1 | 6/2006 | Boezen et al. | |
| 2006/0274399 A1 | 12/2006 | Yang | |
| 2007/0181962 A1 | 8/2007 | Partridge et al. | |
| 2007/0281379 A1 | 12/2007 | Stark et al. | |
| 2008/0014682 A1 | 1/2008 | Yang et al. | |
| 2008/0123242 A1 | 5/2008 | Zhou | |

(Continued)

OTHER PUBLICATIONS

International Search Report and Written Opinion of PCT Application No. PCT/US10/054567, mailed on Jan. 6, 2011, 7 pages total.

(Continued)

*Primary Examiner* — David Nhu
(74) *Attorney, Agent, or Firm* — Kilpatrick Townsend & Stockton LLP

(57) ABSTRACT

An apparatus for packaging MEMS and ICs can include a semiconductor substrate, one or more MEMS devices, an enclosure, and one or more bonding structures. The semiconductor substrate can be bonded to a portion of the surface region. The semiconductor substrate can include one or more integrated circuits. Also, the semiconductor substrate can have an upper surface region. The one or more MEMS devise can overlie an inner region of the upper surface region formed by the semiconductor substrate. The enclosure can house the one or more MEMS devices. The enclosure can overlie a first outer region of the upper surface region. Also, the enclosure can have an upper cover region. The one or more bonding structures can be provided within a second outer region of the supper surface region.

23 Claims, 13 Drawing Sheets

U.S. PATENT DOCUMENTS

2008/0211113 A1 9/2008 Chua et al.
2011/0265574 A1* 11/2011 Yang .............................. 73/658

OTHER PUBLICATIONS

Notice of Allowance for U.S. Appl. No. 13/007,574, mailed on Apr. 6, 2012, 5 pages.
Non-Final Office Action for U.S. Appl. No. 12/859,647, mailed on Oct. 25, 2012, 8 pages.
Non-Final Office Action for U.S. Appl. No. 12/859,672, mailed on Oct. 25, 2012, 16 pages.
Non-Final Office Action for U.S. Appl. No. 12/913,440, mailed on Sep. 10, 2012, 9 pages.
Notice of Allowance for U.S. Appl. No. 13/082,384, mailed on Sep. 28, 2012, 8 pages.

* cited by examiner

INTEGRATED MEMS AND CMOS PACKAGE AND METHOD

CROSS-REFERENCES TO RELATED APPLICATIONS

The present application claims priority to and incorporates by reference, for all purposes, the following pending patent application: U.S. Pat. App. No. 61/260,847, filed Nov. 13, 2009. The present invention also incorporates by reference, for all purposes, the following co-pending patent applications related to sensor and MEMS devices: U.S. patent application Ser. No. 12/859,631, filed Aug. 19, 2010, U.S. Pat. App. No. 61/356,467, filed Jun. 18, 2010, U.S. patent application Ser. No. 12/859,672, filed Aug. 19, 2010, U.S. patent application Ser. No. 12/859,647, filed Aug. 19, 2010, and U.S. patent application Ser. No. 12/913,440, filed Oct. 27, 2010.

BACKGROUND OF THE INVENTION

The present invention relates generally to integrated devices. More particularly, the present invention provides a system and method for integrating at least two different micro electro mechanical systems (MEMS) devices with one or more complementary metal oxide semiconductor (CMOS) devices. Merely by way of example, the MEMS devices can include an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to packaging are provided. The present invention relates generally to packaging techniques. More particularly, the present invention provides an improved package for integrated circuits and micro-electrical mechanical systems, commonly termed MEMS. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

In various embodiments, the present invention provides a package and related method to substantially eliminate a large spatial region between one or more bonding pads and MEMS, which leads to more efficient use of area. Of course, there can be other variations, modifications, and alternatives.

In various embodiments, the present invention provides an apparatus for packaging MEMS and ICs. The apparatus can comprise a substrate member, a semiconductor substrate, one or more MEMS devices, an enclosure, and one or more bonding structures. In an embodiment, the substrate member can have a surface region. The semiconductor substrate can be bonded to a portion of the surface region. In a specific embodiment, the semiconductor substrate can comprise one or more integrated circuits. Also, the semiconductor substrate can have an upper surface region. In an embodiment, the one or more MEMS devices can overlie an inner region of the upper surface region formed by the semiconductor substrate. The enclosure can house the one or more MEMS devices. The enclosure can overlie a first outer region of the upper surface region. Also, the enclosure can have an upper cover region. In a specific embodiment, the one or more bonding structures can be provided within a second outer region of the upper surface region. Additionally, the one or more bonding structures can have one or more bonding pads within a vicinity of the upper cover region. Of course, there can be other variations, modifications, and alternatives.

In various embodiments, the present invention provides a type of apparatus for packaging MEMS and ICs. The apparatus can comprise a semiconductor substrate, one or more MEMS devices, an enclosure, and one or more bonding structures. In an embodiment, the semiconductor substrate can have a surface region and a backside region. The surface region can comprise an inner surface region, a first outer region, and a second outer region. Also, the semiconductor substrate can comprise one or more integrated circuits. In an embodiment, the one or more MEMS devices overlie the inner region of the surface region formed by the semiconductor substrate. The enclosure can house the one or more MEMS devices. In an embodiment, the enclosure can be configured to overlie the first outer region of the surface region. In a specific embodiment, the one or more bonding structures can be provided through a thickness of the semiconductor substrate. The one or more bonding structures can be configured to overlie the second outer region of surface region. Additionally, each of the bonding structures can have a first bonding pad within a vicinity of the first outer region, a via structure, and a second bonding pad within a portion of the backside region.

In various embodiments, the present invention provides a type of apparatus for packaging MEMS and ICs. The apparatus can comprise a semiconductor substrate, one or more MEMS devices, an enclosure, and one or more bonding structures. In an embodiment, the semiconductor substrate can have a surface region and a backside region. The surface region can comprise an inner surface region and a first outer region. Also, the semiconductor substrate can comprise one or more integrated circuits. In an embodiment, the one or more MEMS devices overlie the inner region of the surface region formed by the semiconductor substrate. The enclosure can house the one or more MEMS devices. In an embodiment, the enclosure can be configured to overlie the first outer region of the surface region. In a specific embodiment, the one or more bonding structures can be provided through a thickness of the enclosure housing. The one or more bonding structures can be configured to overlie the first outer region of surface region. Additionally, each of the bonding structures can have a first bonding pad within a vicinity of the first outer region, a via structure, and a second bonding pad within a portion of the backside region.

Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved CMOS integrated circuit device and related methods for a variety of uses. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques related generally to packaging are provided. The present invention relates generally to packaging techniques. More particularly, the present invention provides an improved package for integrated circuits and micro-electrical mechanical systems, commonly termed MEMS. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1:
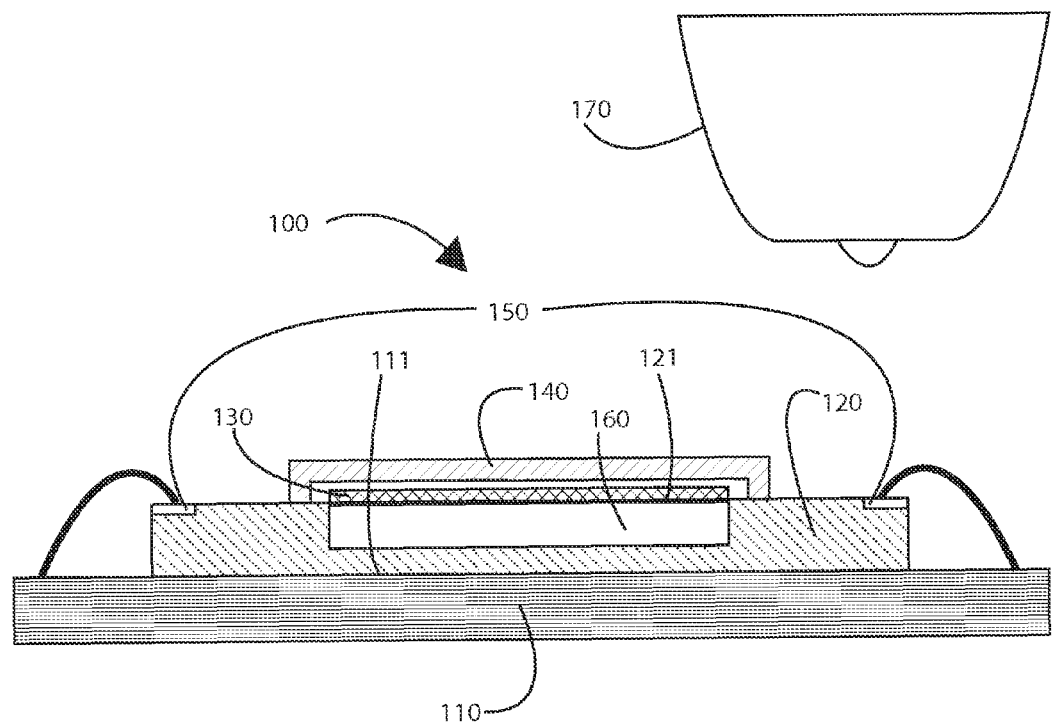
FIG. 1 is a simplified system diagram of an electronic packaging according to a conventional device.

FIG. 1 is a simplified diagram of an electronic packaging according to a conventional device. As shown, the apparatus 100 includes a substrate member 110, a semiconductor substrate 120, a MEMS device 130, an enclosure 140, and one or more bonding pads 150. The substrate member 110 has a surface region 111. The semiconductor substrate 120 comprises one or more integrated circuits 160. The semiconductor substrate 120 is bonded to a portion of the surface region 111 of the substrate member 110. The semiconductor substrate 120 has an upper surface region 121. The MEMS device 130 overlies an inner region of the upper surface region 121. The enclosure 140 houses the MEMS device 130 and overlies a first outer region of the upper surface region 121. The bonding pads 150 are configured on an outer region of the upper surface region 121 formed by the semiconductor substrate 120.

Figure 2:
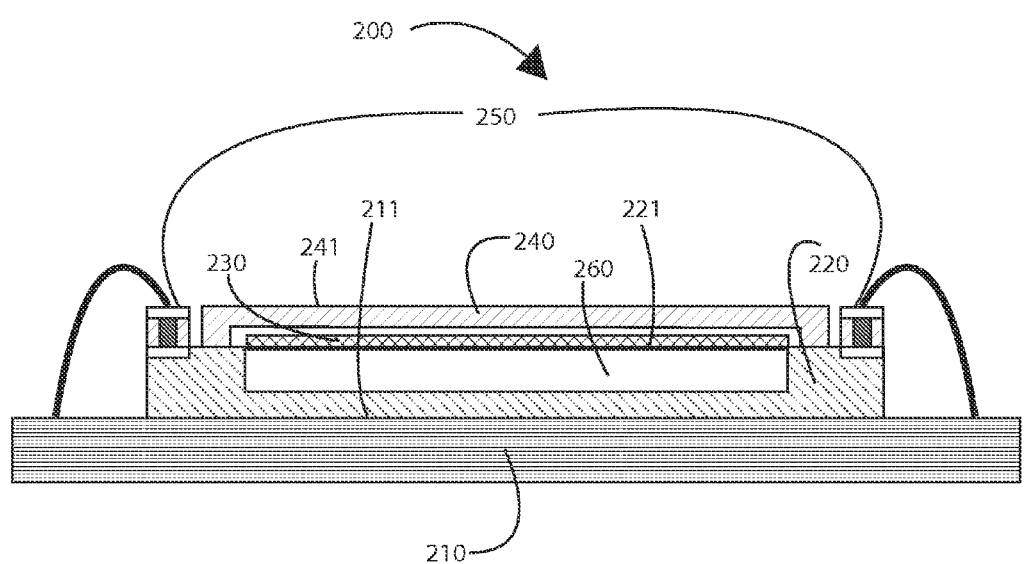
FIG. 2 is a simplified system diagram of an electronic packaging according to an embodiment of the present invention.
Figure 3:
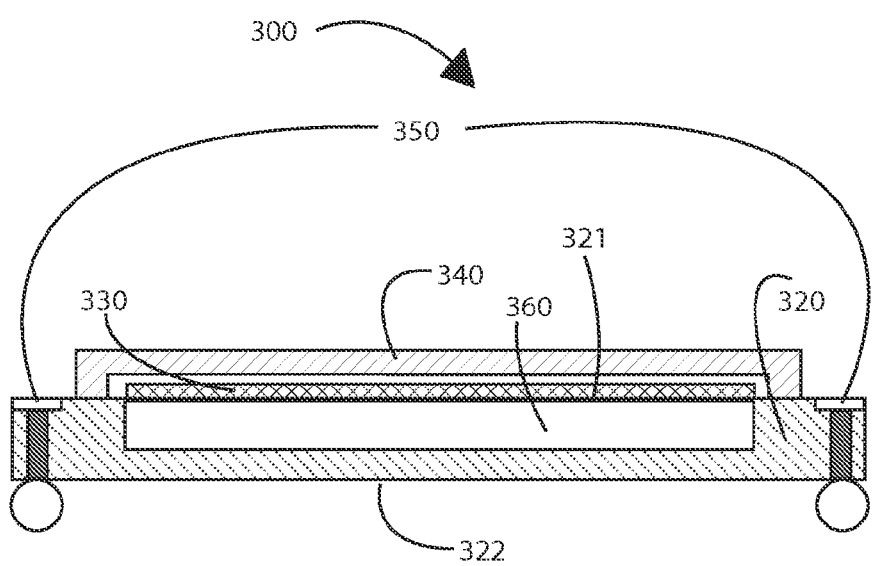
FIG. 3 is a simplified system diagram of an electronic packaging according to an embodiment of the present invention.
Figure 4:
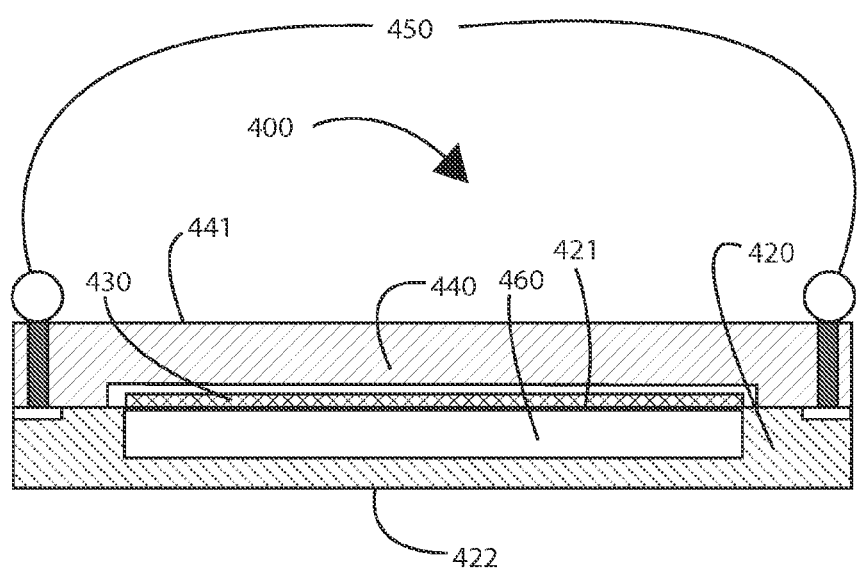
FIG. 4 is a simplified system diagram of an electronic packaging according to an embodiment of the present invention.

As shown, the apparatus 100 presents a considerable problem for the traditional ball bonding process. Ball bonding is a common type of wire bonding used to make electrical connections as part of semiconductor device fabrication. The ball bonding process uses a capillary 170 to attach a wire to the bonding pads 150. However, the capillary 150 cannot reach the bonding pads 150 because it is obstructed by the enclosure 140. The following FIGS. 2-4 present novel configurations of apparatus types for packaging MEMS and ICs. Further details regarding these apparatus types are provided below.

FIG. 2 is a simplified diagram of an electronic packaging according to an embodiment of the present invention. This diagram is merely an example, which should not unduly limit the scope of the claims herein. One of ordinary skill in the art would recognize other variations, modifications, and alternatives. As shown, the apparatus 200 includes a substrate member 210, a semiconductor substrate 220, one or more MEMS devices 230, an enclosure 240, and one or more bonding structures 250. The substrate member 210 can have a surface region 211. In an embodiment, the substrate 210 can be a semiconductor, metal, a dielectric, or any other material type. Also, the substrate 210 can comprise a PCB, a lead frame, a silicon material, or others. In a specific embodiment, the semiconductor substrate 220 can comprise one or more integrated circuits 260. Also, the semiconductor substrate 220 can be bonded to a portion of the surface region 211 of the substrate member 210. The semiconductor substrate 220 can have an upper surface region 221. In a specific embodiment, the semiconductor substrate 220 is characterized by a thickness of about 600 to about 800 microns. There can be other variations, modifications, and alternatives to the substrates described herein.

In an embodiment, the one or more MEMS devices 230 overlie an inner region of the upper surface region 221 formed by the semiconductor substrate 220. The one or more MEMS devices 230 can be selected from an accelerometer, a gyroscope, a magnetic sensor, a pressure sensor, a microphone, a humidity sensor, a temperature sensor, a chemical sensor, a biosensor, an inertial sensor, or others. In an embodiment, the upper surface region 221 formed by the semiconductor substrate 220 can comprise a dielectric material, and others. Also, the upper surface region 221 can comprise an inner region, a first outer region, and a second outer region. In an embodiment, the first outer region and second outer region is characterized by a width of about 200 microns or less and 100 microns or less, respectively. In a specific embodiment, the enclosure 240 can house the one or more MEMS devices 230. The enclosure 240 can overlie the first outer region of the upper surface region 221. Also, the enclosure 240 can have an upper cover region 241. In an embodiment, an opening can be provided between the enclosure 240 and the one or more MEMS devices 230. In various embodiments, the opening can be filled with one or more gasses. Of course, there can be other variations, modifications, and alternatives.

In a specific embodiment, the one or more bonding structures 250 can each have a bonding pad within a vicinity of the upper cover region 241 formed by the enclosure 240. The one or more bonding structures 250 can also be provided within a second outer region of the upper surface region 221. In a specific embodiment, each of the bonding structures 250 can comprise a bonding pad, a via structure, and a pad structure. The pad structure can be integrally coupled to the one or more integrated circuits 260. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

FIG. 3 is a simplified diagram of an electronic packaging according to an embodiment of the present invention. This diagram is merely an example, which should not unduly limit the scope of the claims herein. One of ordinary skill in the art would recognize other variations, modifications, and alternatives. As shown, the apparatus 300 includes a semiconductor substrate 320, one or more MEMS devices 330, an enclosure 340, and one or more bonding structures 350. In a specific embodiment, the semiconductor substrate 320 can comprise one or more integrated circuits 360. The semiconductor substrate 320 can have a surface region 321 and a backside region 322. The surface region 321 can comprise an inner region, a first outer region, and a second outer region. In a specific embodiment, the semiconductor substrate 320 is characterized by a thickness of about 600 to about 800 microns. Additionally, the surface region 321 can comprise a dielectric material, and others. There can be other variations, modifications, and alternatives to the substrates described herein.

In an embodiment, the one or more MEMS devices 330 overlie an inner region of the surface region 321 formed by the semiconductor substrate 320. The one or more MEMS devices 330 can be selected from an accelerometer, a gyroscope, a magnetic sensor, a pressure sensor, a microphone, a humidity sensor, a temperature sensor, a chemical sensor, a biosensor, an inertial sensor, or others. In an embodiment, the surface region 321 formed by the semiconductor substrate 320 can comprise a dielectric material, and others. Also, the surface region 321 can comprise an inner region, a first outer region, and a second outer region. In an embodiment, the first outer region and second outer region is characterized by a width of about 200 microns or less and 100 microns or less, respectively. In a specific embodiment, the enclosure 340 can house the one or more MEMS devices 330. The enclosure 340 can overlie the first outer region of the surface region 321. In an embodiment, an opening can be provided between the enclosure 340 and the one or more MEMS devices 330. In various embodiments, the opening can be filled with one or more gasses. Of course, there can be other variations, modifications, and alternatives.

In a specific embodiment, the one or more bonding structures 350 can be provided through a thickness of the semiconductor substrate 320. The one or more bonding structures 250 can also be configured to overlie the second outer region of the surface region 321. In a specific embodiment, each of the bonding structures 250 can comprise a bonding pad, a via structure, and a pad structure. The bonding pad can be provided within a vicinity of the first outer region, and the second bonding pad can be provided within a portion of the backside region 322. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

FIG. 4 is a simplified diagram of an electronic packaging according to an embodiment of the present invention. This diagram is merely an example, which should not unduly limit the scope of the claims herein. One of ordinary skill in the art would recognize other variations, modifications, and alternatives. As shown, the apparatus 400 includes a semiconductor substrate 420, one or more MEMS devices 430, an enclosure 440, and one or more bonding structures 450. In a specific embodiment, the semiconductor substrate 420 can comprise one or more integrated circuits 460. The semiconductor substrate 420 can have a surface region 421 and a backside region 422. The surface region 421 can comprise an inner region and a first outer region. In a specific embodiment, the semiconductor substrate 420 is characterized by a thickness of about 600 to about 800 microns. Additionally, the surface region 421 can comprise a dielectric material, and others. There can be other variations, modifications, and alternatives to the substrates described herein.

In an embodiment, the one or more MEMS devices 430 overlie an inner region of the surface region 421 formed by the semiconductor substrate 420. The one or more MEMS devices 430 can be selected from an accelerometer, a gyroscope, a magnetic sensor, a pressure sensor, a microphone, a humidity sensor, a temperature sensor, a chemical sensor, a biosensor, an inertial sensor, or others. In an embodiment, the surface region 421 formed by the semiconductor substrate 420 can comprise a dielectric material, and others. Also, the surface region 421 can comprise an inner region, a first outer region, and a second outer region. In an embodiment, the first outer region and second outer region is characterized by a width of about 200 microns or less and 100 microns or less, respectively. In a specific embodiment, the enclosure 440 can house the one or more MEMS devices 430. The enclosure 440 can overlie the first outer region of the surface region 421. Also, the enclosure can have an upper cover region 441. In an embodiment, an opening can be provided between the enclosure 440 and the one or more MEMS devices 430. In various embodiments, the opening can be filled with one or more gasses. Of course, there can be other variations, modifications, and alternatives.

In a specific embodiment, the one or more bonding structures 450 can be provided through a thickness of the semiconductor substrate 420. The one or more bonding structures 450 can also be configured to overlie the first outer region of the surface region 421. In a specific embodiment, each of the bonding structures 450 can comprise a bonding pad, a via structure, and a pad structure. The bonding pad can be provided within a vicinity of the first outer region, and the second bonding pad can be provided within a portion of the upper cover region 441. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5:
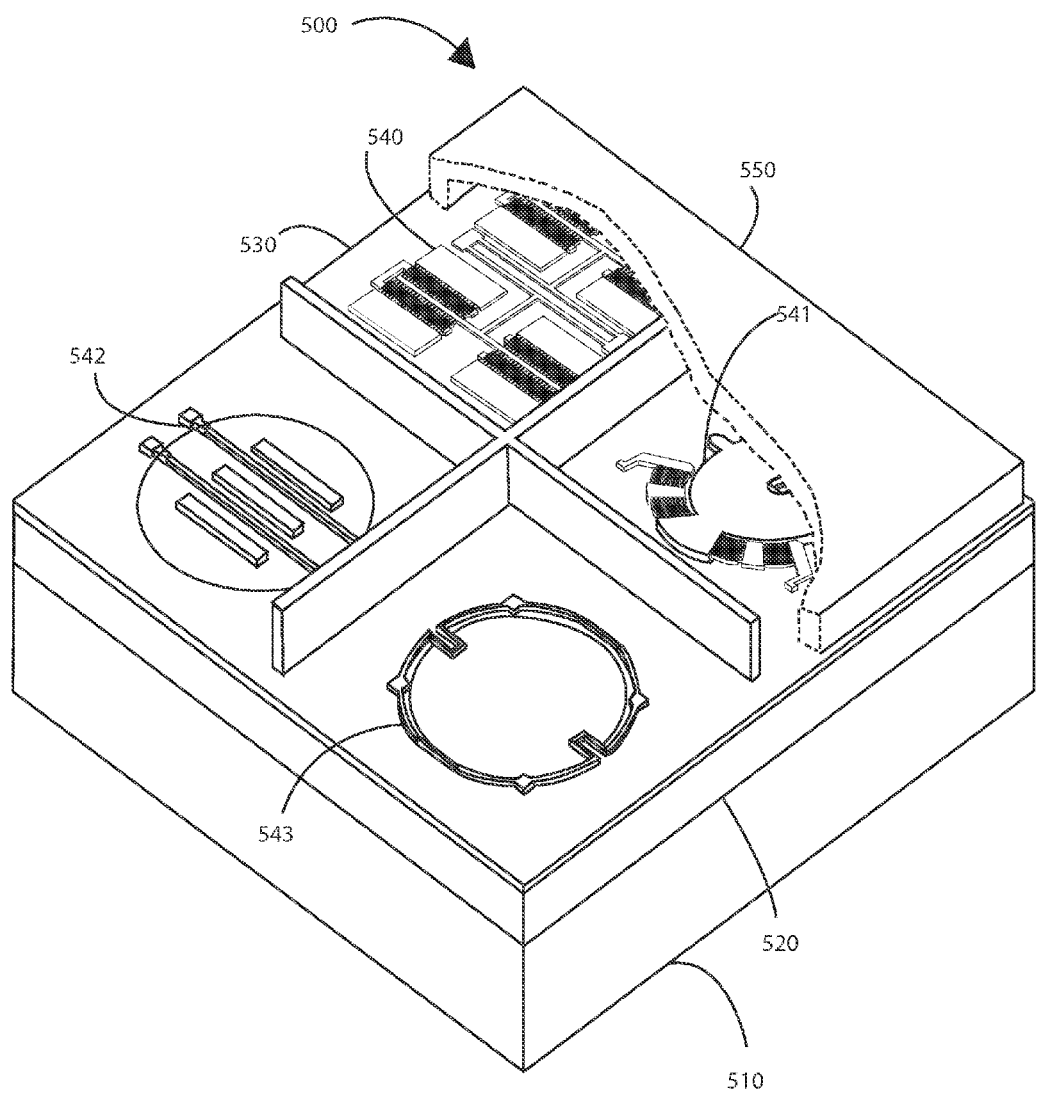
FIG. 5 is a simplified perspective diagram of an integrated CMOS-MEMS system according to an embodiment of the present invention.

FIG. 5 is a simplified perspective diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 500 includes a substrate layer 510, a semiconductor layer 520, integrated devices 540-543, and an encapsulation layer 550. In a specific embodiment, the each of the devices 540-543 can include a MEMS device; FIG. 5 depicts the integrated system as having an accelerometer 540, a gyroscope 541, a magnetic sensor 542, and a pressure sensor 543. These MEMS devices are integrated with the common semiconductor layer 520 on top of the common substrate layer 510 and are covered by the encapsulation layer 550. In an embodiment, the common semiconductor layer 520 can be made of a silicon material or any other appropriate semiconductor. The semiconductor layer 520 can include a CMOS layer or any other appropriate layer for implementing microelectronics. The CMOS layer 520 creates a surface region which forms an interface region 530, on which the devices 540-543 can be configured. Further details of various integration techniques of the component layers and devices are provided below.

In various embodiments, the MEMS devices 540-543 can include any combination of MEMS devices. These can include accelerometers, gyroscopes, microphones, and sensors. Though not exclusively, the sensors can by any of the following types: magnetic, pressure, humidity, temperature, chemical, biological, or inertial. In further embodiments, any number of MEMS devices can be included in the integrated system 500, and each of these devices can comprise one or more deposited materials, one or more bonded materials, or others. Of course, there can be other variations, modifications, and alternatives.

In various embodiments, the semiconductor layer 520 can include a CMOS layer comprised of any number of metal layers and can be provided on any type of design rule, such as a 0.18 micron design rule or less. Also, the interface region 530 formed by the semiconductor layer can be integrated with any number of CMOS devices, which can be configured from a foundry compatible process. The devices 540-543, and possibly additional devices, can all be configured individually in separate portions of the interface region 530. In further embodiments, the MEMS devices 540-543, and additional devices, and comprise an upper surface region that faces away from the CMOS layer 520 and devices. One skilled in the art would recognize other variations, modifications, and alternatives.

In various embodiments, the overlying encapsulation layer 550 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 550 can be configured to hermetically seal any number of the integrated devices on the interface region 530. Again, there can be many other variations, modifications, and alternatives.

The present technique provides an easy to use process that relies upon conventional technology. This technique can reduce off-chip connections, which makes the mass production of smaller and thinner units possible. Also, integrated CMOS-MEMS technology can achieve high accuracy through the minimization of parasitic resistances and capacitances due to joint fabrication. In some embodiments, the method provides higher device yields in dies per wafer with the integrated approach. Additionally, the method provides a process and system that are compatible with conventional process technology without substantial modifications to conventional equipment and processes.

It is also understood that the examples and embodiments described herein are for illustrative purposes only and that various modifications or changes in light thereof will be suggested to persons skilled in the art and are to be included within the spirit and purview of this application and scope of the appended claims. Further details of the integration of CMOS and MEMS devices can be found throughout the present specification and more particularly below.

Figure 6:
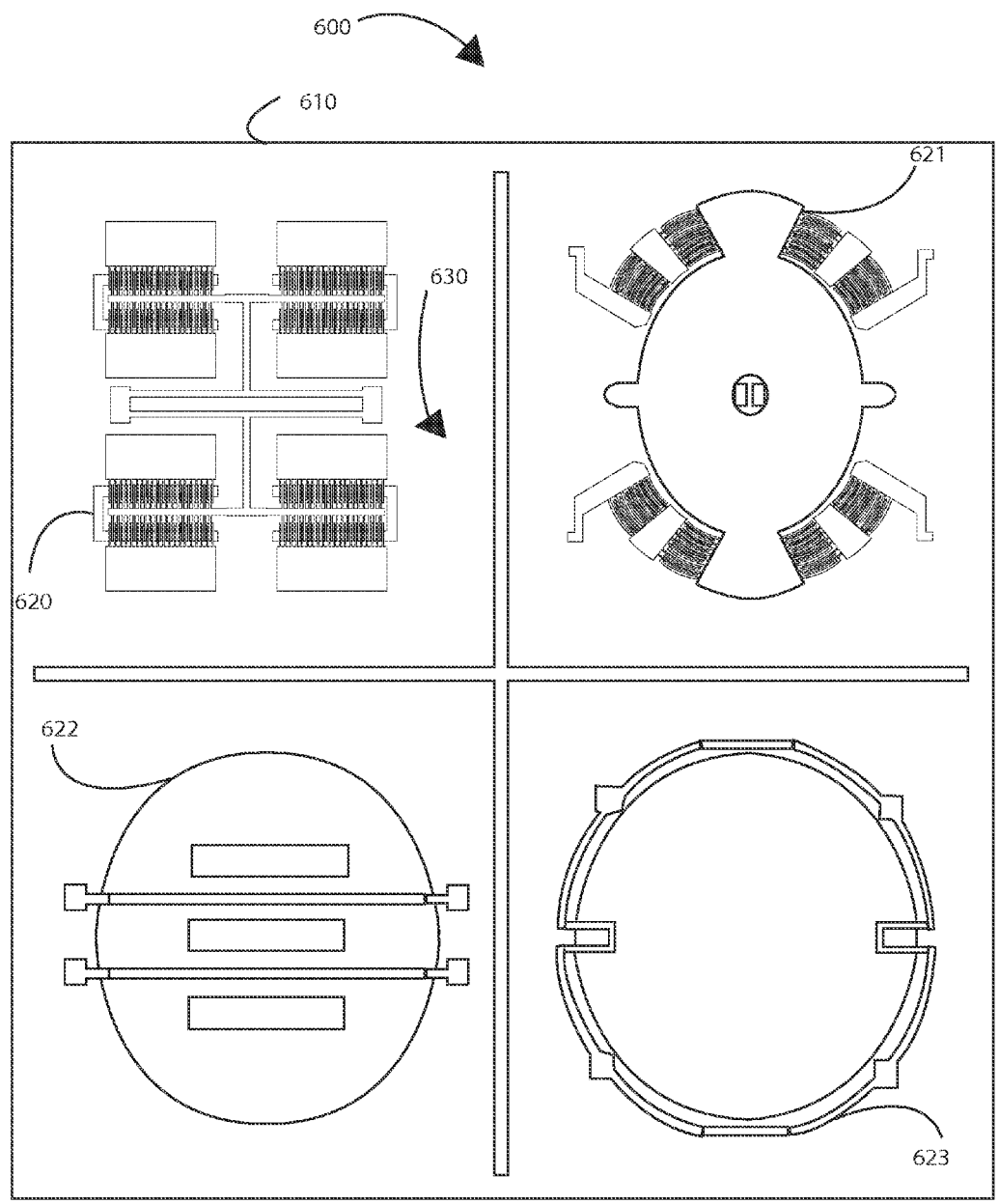
FIG. 6 is a simplified top diagram of an integrated CMOS-MEMS system according to an embodiment of the present invention.

FIG. 6 is a simplified top diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 600 includes a semiconductor layer 610, devices 620-623, and an interface region 630. Of course, there can be other variations, modifications, and alternatives. In a specific embodiment, the each of the devices 620-623 can include a MEMS device; FIG. 6 depicts the integrated system 600 as having an accelerometer 620, a gyroscope 621, a magnetic sensor 622, and a pressure sensor 623. These MEMS devices are integrated with the common semiconductor layer 610. In an embodiment, the common semiconductor layer 610 can be made of a silicon material or any other appropriate semiconductor. The semiconductor layer 610 can include a CMOS layer or any other appropriate layer for implementing microelectronics. The CMOS layer 610 creates a surface region which forms an interface region 630, on which the devices 620-623 can be configured.

In various embodiments, the MEMS devices 620-623 can include any combination of MEMS devices. These can include accelerometers, gyroscopes, microphones, and sensors. Though not exclusively, the sensors can by any of the following types: magnetic, pressure, humidity, temperature, chemical, biological, or inertial. In further embodiments, any number of MEMS devices can be included in the integrated system 600, and each of these devices can comprise one or more deposited materials, one or more bonded materials, or others. Of course, there can be other variations, modifications, and alternatives.

In various embodiments, the semiconductor layer 610 can include a CMOS layer comprised of any number of metal layers and can be provided on any type of design rule, such as a 0.18 micron design rule or less. Also, the interface region 630 formed by the semiconductor layer can be integrated with any number of CMOS devices, which can be configured from a foundry compatible process. The devices 620-623, and possibly additional devices, can all be configured individually in separate portions of the interface region 630. In further embodiments, the MEMS devices 620-623, and additional devices, and comprise an upper surface region that faces away from the CMOS layer 610 and devices. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 7:
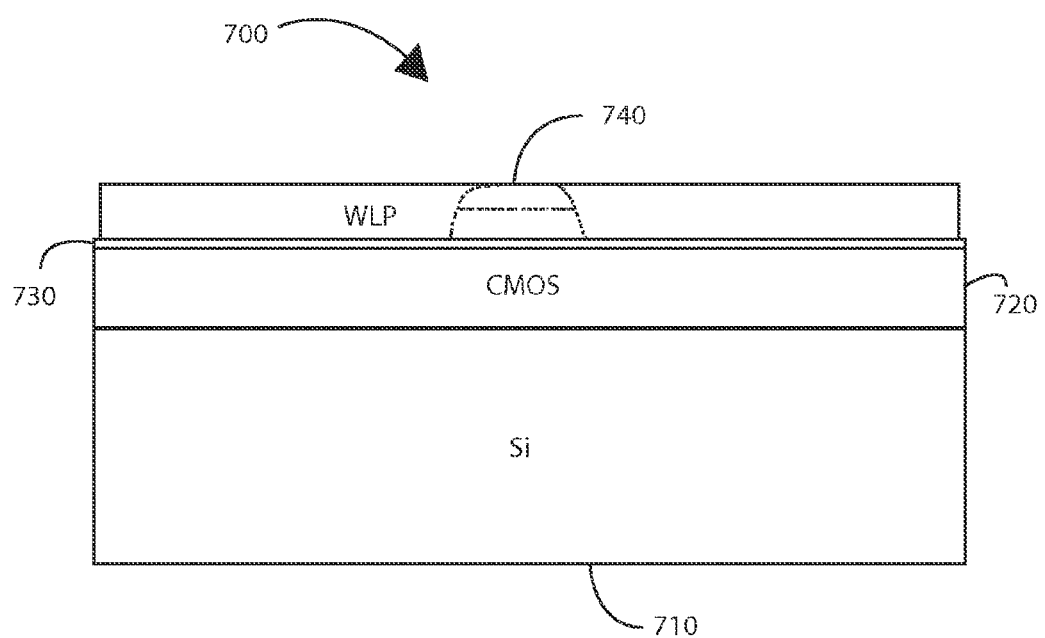
FIG. 7 is a simplified side diagram of an integrated CMOS-MEMS system according to an embodiment of the present invention.

FIG. 7 is a simplified side diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 700 includes a substrate layer 710, a semiconductor layer 720, and an encapsulation layer 740. The semiconductor layer 720 covers the substrate layer 710 while also creating a surface region that forms an interface region 730. In an embodiment, the common semiconductor layer 720 can be made of a silicon material or any other appropriate semiconductor. The semiconductor layer 720 can include a CMOS layer or any other appropriate layer for implementing microelectronics.

In various embodiments, the semiconductor layer 720 can include a CMOS layer comprised of any number of metal layers and can be provided on any type of design rule, such as a 0.18 micron design rule or less. Also, the interface region 730 formed by the semiconductor layer can be integrated with any number of MEMS devices and CMOS devices; the CMOS devices can be configured from a foundry compatible process. The CMOS and MEMS devices can all be configured individually in separate portions of the interface region 730. One skilled in the art would recognize other variations, modifications, and alternatives.

In various embodiments, the overlying encapsulation layer 740 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 740 can be configured to hermetically seal any number of the integrated devices on the interface region 730. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 8:
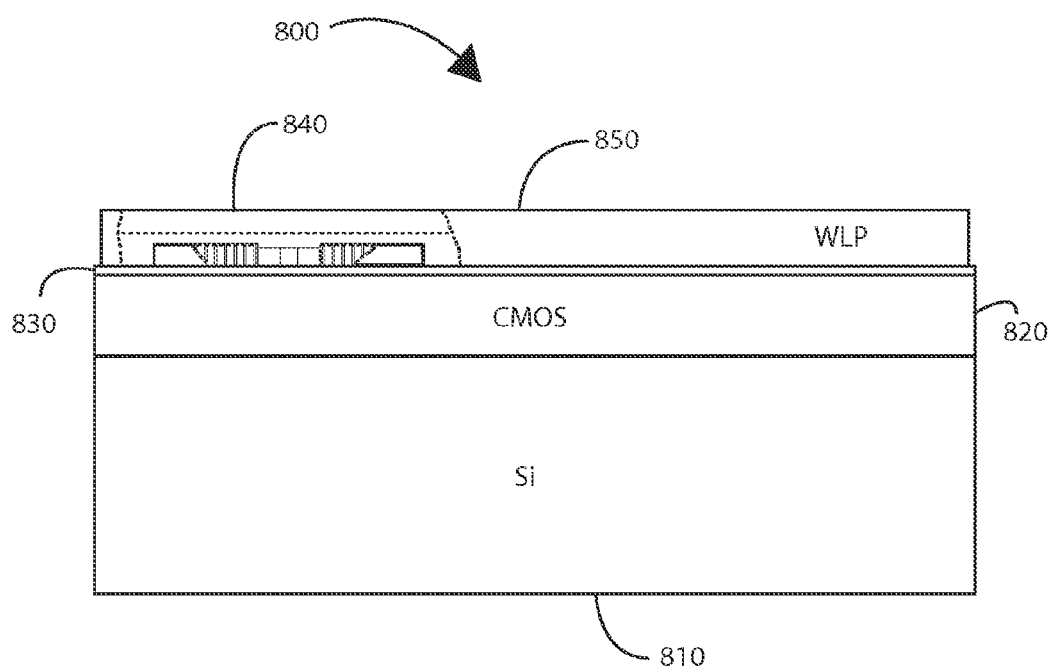
FIG. 8 is a simplified side diagram of an integrated CMOS-MEMS system according to an embodiment of the present invention.

FIG. 8 is a simplified side diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 800 includes a substrate layer 810, a semiconductor layer 820, an integrated device 840, and an encapsulation layer 850. The semiconductor layer 820 covers the substrate layer 810 while also creating a surface region that forms an interface region 830. In an embodiment, the common semiconductor layer 820 can be made of a silicon material or any other appropriate semiconductor. The semiconductor layer 820 can include a CMOS layer or any other appropriate layer for implementing microelectronics.

In various embodiments, the semiconductor layer 820 can include a CMOS layer comprised of any number of metal layers and can be provided on any type of design rule, such as a 0.18 micron design rule or less. Also, the interface region 830 formed by the semiconductor layer can be integrated with any number of MEMS devices and CMOS devices; the CMOS devices can be configured from a foundry compatible process. The CMOS and MEMS devices can all be configured individually in separate portions of the interface region 830. One skilled in the art would recognize other variations, modifications, and alternatives.

In a specific embodiment, the integrated device 840 can be an accelerometer. In further embodiments, any number of MEMS devices can be included in the integrated system 800, and each of these devices can comprise one or more deposited materials, one or more bonded materials, or others. Of course, there can be other variations, modifications, and alternatives.

In various embodiments, the overlying encapsulation layer 840 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 840 can be configured to hermetically seal any number of the integrated devices on the interface region 830. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 9:
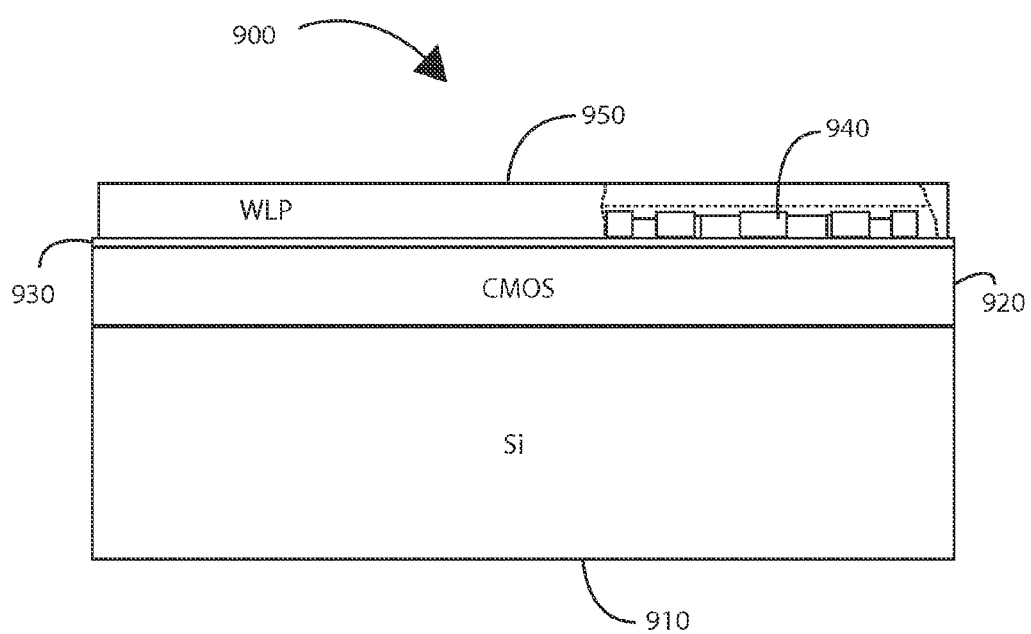
FIG. 9 is a simplified side diagram of an integrated CMOS-MEMS system according to an embodiment of the present invention.

FIG. 9 is a simplified side diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 900 includes a substrate layer 910, a semiconductor layer 920, an integrated device 940, and an encapsulation layer 950. The semiconductor layer 920 covers the substrate layer 910 while also creating a surface region that forms an interface region 930. In an embodiment, the common semiconductor layer 920 can be made of a silicon material or any other appropriate semiconductor. The semiconductor layer 920 can include a CMOS layer or any other appropriate layer for implementing microelectronics.

In various embodiments, the semiconductor layer 920 can include a CMOS layer comprised of any number of metal layers and can be provided on any type of design rule, such as a 0.18 micron design rule or less. Also, the interface region 930 formed by the semiconductor layer can be integrated with any number of MEMS devices and CMOS devices; the CMOS devices can be configured from a foundry compatible process. The CMOS and MEMS devices can all be configured individually in separate portions of the interface region 930. One skilled in the art would recognize other variations, modifications, and alternatives.

In a specific embodiment, the integrated device 940 can be a gyroscope. In further embodiments, any number of MEMS devices can be included in the integrated system 900, and each of these devices can comprise one or more deposited materials, one or more bonded materials, or others. Of course, there can be other variations, modifications, and alternatives.

In various embodiments, the overlying encapsulation layer 940 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 940 can be configured to hermetically seal any number of the integrated devices on the interface region 930. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 10:
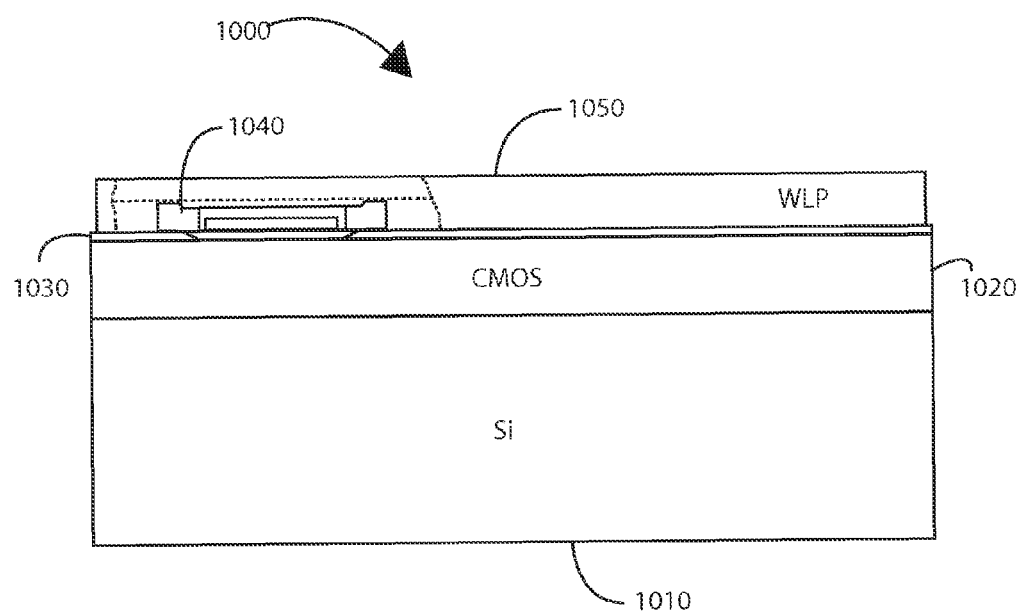
FIG. 10 is a simplified side diagram of an integrated CMOS-MEMS system according to an embodiment of the present invention.

FIG. 10 is a simplified side diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 1000 includes a substrate layer 1010, a semiconductor layer 1020, an integrated device 1040, and an encapsulation layer 1050. The semiconductor layer 1020 covers the substrate layer 1010 while also creating a surface region that forms an interface region 1030. In an embodiment, the common semiconductor layer 1020 can be made of a silicon material or any other appropriate semiconductor. The semiconductor layer 1020 can include a CMOS layer or any other appropriate layer for implementing microelectronics.

In various embodiments, the semiconductor layer 1020 can include a CMOS layer comprised of any number of metal layers and can be provided on any type of design rule, such as a 0.18 micron design rule or less. Also, the interface region 1030 formed by the semiconductor layer can be integrated with any number of MEMS devices and CMOS devices; the CMOS devices can be configured from a foundry compatible process. The CMOS and MEMS devices can all be configured individually in separate portions of the interface region 1030. One skilled in the art would recognize other variations, modifications, and alternatives.

In a specific embodiment, the integrated device 1040 can be a magnetic sensor. In further embodiments, any number of MEMS devices can be included in the integrated system 1000, and each of these devices can comprise one or more deposited materials, one or more bonded materials, or others. Of course, there can be other variations, modifications, and alternatives.

In various embodiments, the overlying encapsulation layer 1040 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 1040 can be configured to hermetically seal any number of the integrated devices on the interface region 1030. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 11:
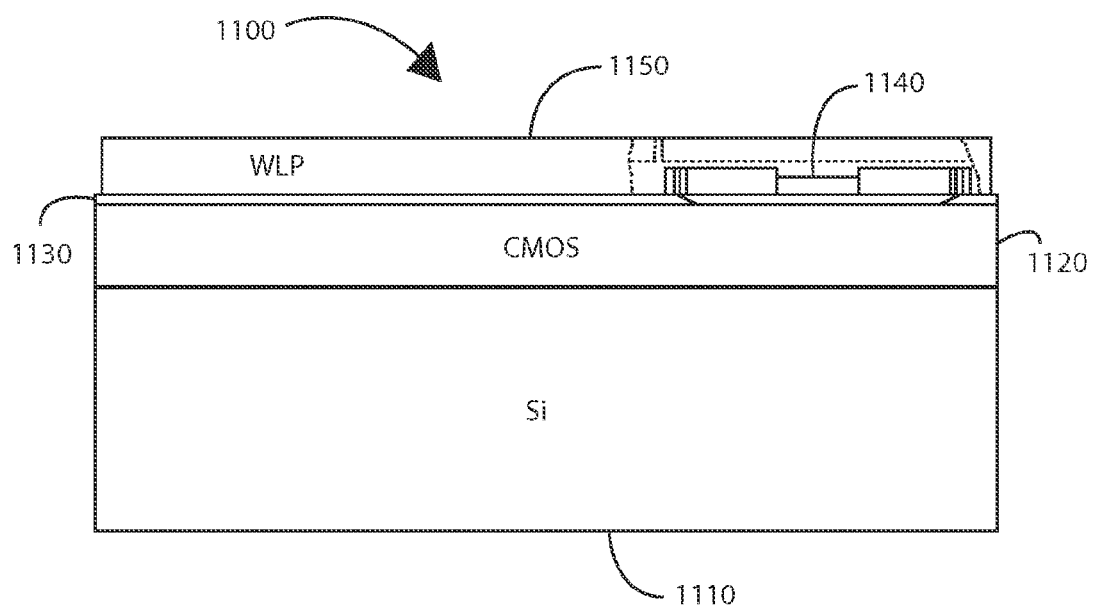
FIG. 11 is a simplified side diagram of an integrated CMOS-MEMS system according to an embodiment of the present invention.

FIG. 11 is a simplified side diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 1100 includes a substrate layer 1110, a semiconductor layer 1120, an integrated device 1140, and an encapsulation layer 1150. The semiconductor layer 1120 covers the substrate layer 1110 while also creating a surface region that forms an interface region 1130. In an embodiment, the common semiconductor layer 1120 can be made of a silicon material or any other appropriate semiconductor. The semiconductor layer 1120 can include a CMOS layer or any other appropriate layer for implementing microelectronics.

In various embodiments, the semiconductor layer 1120 can include a CMOS layer comprised of any number of metal layers and can be provided on any type of design rule, such as a 0.18 micron design rule or less. Also, the interface region 1130 formed by the semiconductor layer can be integrated with any number of MEMS devices and CMOS devices; the CMOS devices can be configured from a foundry compatible process. The CMOS and MEMS devices can all be configured individually in separate portions of the interface region 1130. One skilled in the art would recognize other variations, modifications, and alternatives.

In a specific embodiment, the integrated device 1140 can be a pressure sensor. In further embodiments, any number of MEMS devices can be included in the integrated system 1100, and each of these devices can comprise one or more deposited materials, one or more bonded materials, or others. Of course, there can be other variations, modifications, and alternatives.

In various embodiments, the overlying encapsulation layer 1140 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 1140 can be configured to hermetically seal any number of the integrated devices on the interface region 1130. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 12:
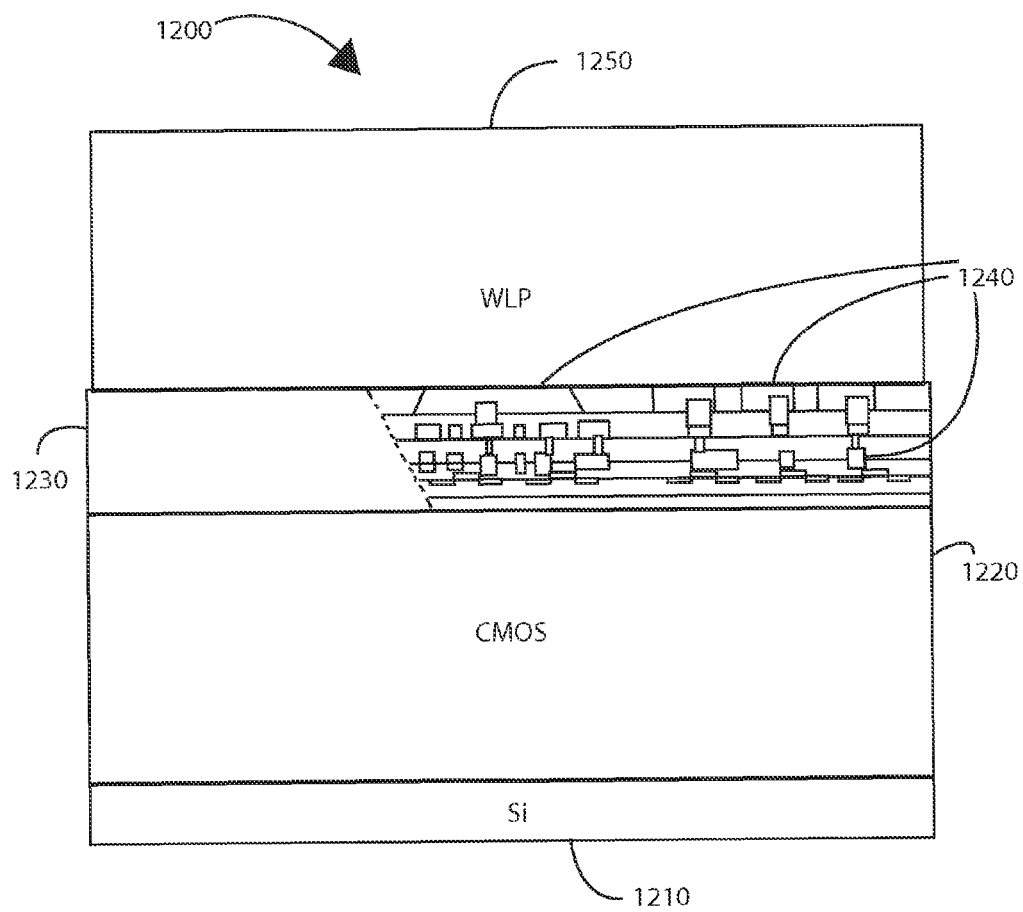
FIG. 12 is a simplified side diagram of an integrated CMOS-MEMS system according to an embodiment of the present invention.

FIG. 12 is a simplified side diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 1200 includes a substrate layer 1210, a semiconductor layer 1220, a CMOS device 1240, and an encapsulation layer 1250. The semiconductor layer 1220 covers the substrate layer 1210 while also creating a surface region that forms an interface region 1230. In an embodiment, the common semiconductor layer 1220 can be made of a silicon material or any other appropriate semiconductor. The semiconductor layer 1220 can include a CMOS layer or any other appropriate layer for implementing microelectronics.

In various embodiments, the semiconductor layer 1220 can include a CMOS layer comprised of any number of metal layers and can be provided on any type of design rule, such as a 0.18 micron design rule or less. The CMOS device 1240 can be integrated into the CMOS layer 1220 and configured with the interface region 1230. Also, the CMOS device 1240 can be configured from a foundry compatible process. Also, the interface region 1230 formed by the semiconductor layer can be integrated with any number of MEMS devices and CMOS devices; the CMOS devices can be configured from a foundry compatible process. The CMOS and MEMS devices can all be configured individually in separate portions of the interface region 830. One skilled in the art would recognize other variations, modifications, and alternatives.

In various embodiments, the overlying encapsulation layer 1250 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 1250 can be configured to hermetically seal any number of the integrated devices on the interface region 1230. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 13:
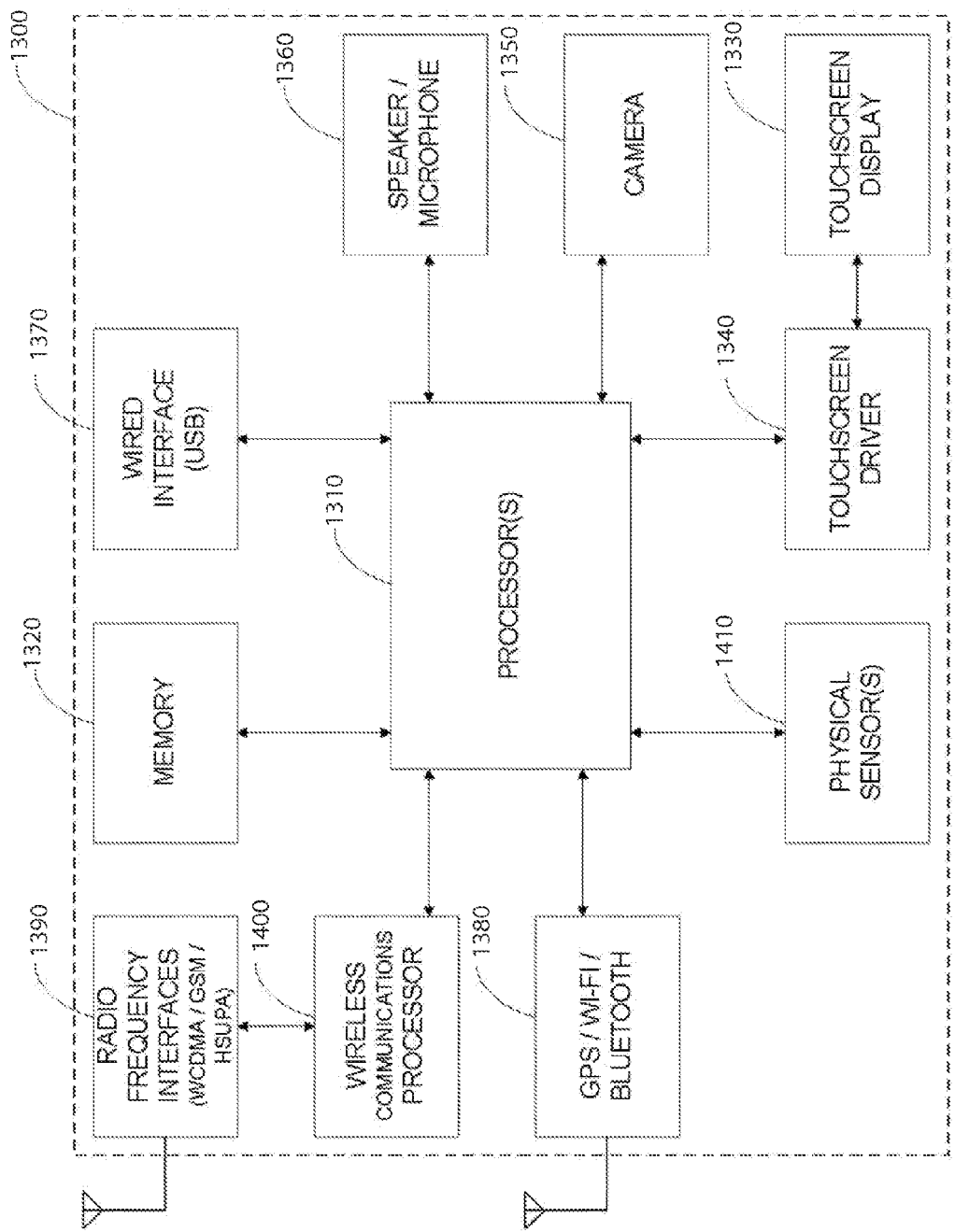
FIG. 13 is a simplified block diagram of a device incorporating various embodiments of the present invention.

FIG. 13 illustrates a functional block diagram of various embodiments of the present invention. In FIG. 13, a computing device or computing system 1300 typically includes an applications processor 1310, memory 1320, a touch screen display 1330 and driver 1340, an image acquisition device 1350, audio input/output devices 1360, and the like. Additional communications from and to computing device are typically provided by via a wired interface 1370, a GPS/Wi-Fi/Bluetooth interface 1380, RF interfaces 1390 and driver 1400, and the like. Also included in various embodiments are physical sensors 1410.

In various embodiments, computing device 1300 may be a hand-held computing device (e.g. Apple iPad, Apple iTouch, Dell Mini slate/Streak, Lenovo Skylight/IdeaPad, Samsung Galaxy Tab, Asus EEE series, HP Slate, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 1300 may include one or more processors 1310. Such processors 1310 may also be termed application processors, and may include a processor core, a video/graphics core, and other cores. Processors 1310 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 1320 may include different types of memory (including memory controllers), such as flash memory (e.g. NOR, NAND), pseudo SRAM, DDR SDRAM, or the like. Memory 1320 may be fixed within computing device 1300 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 1330 and driver 1340 may be based upon a variety of later-developed or current touch screen technology including resistive displays, capacitive displays, optical sensor displays, electromagnetic resonance, or the like. Additionally, touch screen display 1330 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 1350 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 1360 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 1310 to enable the user to operate computing device 1300 by stating voice commands. Additionally, a speech engine may be provided in various embodiments to enable computing device 1300 to provide audio status messages, audio response messages, or the like.

In various embodiments, wired interface 1370 may be used to provide data transfers between computing device 1300 and an external source, such as a computer, a remote server, a storage network, another computing device 1300, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 1380 may also be provided to provide wireless data transfers between computing device 1300 and external sources, such as computers, storage networks, headphones, microphones, cameras, or the like. As illustrated in FIG. 13, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 13, GPS functionality is included as part of wireless interface 1380 merely for sake of convenience, although in implementation, such functionality is currently performed by circuitry that is distinct from the Wi-Fi circuitry and distinct from the Bluetooth circuitry.

Additional wireless communications may be provided via RF interfaces 1390 and drivers 1400 in various embodiments. In various embodiments, RF interfaces 1390 may support any future-developed or conventional radio frequency communications protocol, such as CDMA-based protocols (e.g. WCDMA), GSM-based protocols, HSUPA-based protocols, or the like. In the embodiments illustrated, driver 1400 is illustrated as being distinct from applications processor 1310. However, in some embodiments, these functionality are provided upon a single IC package, for example the Marvel PXA330 processor, and the like. It is contemplated that some embodiments of computing device 1300 need not include the RF functionality provided by RF interface 1390 and driver 1400.

FIG. 13 also illustrates computing device 1300 to include physical sensors 1410. In various embodiments of the present invention, physical sensors 1410 can be single axis or multi-axis Micro-Electro-Mechanical Systems (MEMS) based devices being developed by MCube, the assignee of the present patent application. Physical sensors 1410 can include accelerometers, gyroscopes, pressure sensors, magnetic field sensors, bio sensors, and the like. In various embodiments, physical sensors 1410 may fabricated using the combined CMOS MEMS fabrication techniques described above. More specifically, one or more MEMS devices may be fabricated approximately in parallel using common masks, layers, and processes, above a substrate. In various embodiments, the substrate may be on top of a CMOS device. Both the CMOS and MEMS device may be fabricated using foundry-compatible processes. In other embodiments of the present invention, conventional physical sensors 1410 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 1330 and driver 1340 and inputs/or outputs to physical sensors 1410 may be processed in parallel processing threads. In other embodiments, such events or outputs may be processed serially, or the like. Inputs and outputs from other functional blocks may also be processed in parallel or serially, in other embodiments of the present invention, such as image acquisition device 1350 and physical sensors 1410.

FIG. 13 is representative of one computing device 1300 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 13. For example, in various embodiments, computing device 1200 may lack image acquisition unit 1350, or RF interface 1390 and/or driver 1400, or GPS capability, or the like. Additional functions may also be added to various embodiments of computing device 1300, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

These diagrams are merely examples, which should not unduly limit the scope of the claims herein. In light of the present invention disclosure, one of ordinary skill in the art would recognize many other variations, modifications, and alternatives. For example, various steps outlined above may be added, removed, modified, rearranged, repeated, and/or overlapped, as contemplated within the scope of the invention. It is also understood that the examples and embodiments described herein are for illustrative purposes only and that various modifications or changes in light thereof will be suggested to persons skilled in the art and are to be included within the spirit and purview of this process and scope of the appended claims.

What is claimed is:

1. An apparatus for packaging micro electro-mechanical systems (MEMS) and integrated circuits (ICs), the apparatus comprising:
   a substrate member having a surface region;
   a semiconductor substrate comprising one or more integrated circuits thereon, the semiconductor substrate being bonded to a portion of the surface region and having an upper surface region;
   one or more MEMS devices overlying an inner region of the upper surface region;
   an enclosure housing the one or more MEMS devices and configured overlying a first outer region of the upper surface region, the enclosure housing having an upper cover region; and
   one or more bonding structures, each of the bonding structures having a bonding pad within a vicinity of the upper cover region and provided within a second outer region of the upper surface region,
   wherein the second outer region is characterized by a width of about 100 microns and less, and wherein the first outer region is characterized by a width of about 200 microns and less.

2. The apparatus of claim 1 wherein the substrate comprises a material selected from a group consisting of: a PCB, a lead frame, silicon, a semiconductor, a metal, and a dielectric.

3. The apparatus of claim 1 wherein the semiconductor substrate is characterized by a thickness of about 600 microns to about 800 microns.

4. The apparatus of claim 1 wherein the upper surface region comprises a dielectric material.

5. The apparatus of claim 1 wherein the one or more MEMS devices are selected from a group consisting of: an accelerometer, a gyroscope, a magnetic sensor, a pressure sensor, a microphone, a humidity sensor, a temperature sensor, a chemical sensor, a biosensor, and an inertial sensor.

6. The apparatus of claim 1 wherein the upper surface region comprises the inner surface region, the first outer region, and the second outer region.

7. The apparatus of claim 1 wherein each of the bonding structures comprises the bonding pad, a via structure, and a pad structure, the pad structure being integrally coupled to one or more integrated circuits.

8. The apparatus of claim 1 further comprising a spacing between each of the bonding structures and the enclosure housing.

9. The apparatus of claim 1 further comprising an opening provided between the enclosure housing and the one or more MEMS devices, and wherein the opening is filled with one or more gases.

10. An apparatus for packaging micro electro-mechanical systems (MEMS) and integrated circuits (ICs), the apparatus comprising:
a semiconductor substrate comprising one or more integrated circuits thereon, the semiconductor substrate having a surface region and a backside region, the surface region comprising an inner region, a first outer region, and a second outer region;
one or more MEMS devices overlying the inner region of the surface region;
an enclosure housing the one or more MEMS devices and configured overlying the first outer region of the surface region; and
one or more bonding structures provided through a thickness of the semiconductor substrate and configured overlying the second outer region, each of the bonding structures having a first bonding pad within a vicinity of the first outer region, a via structure, and a second bonding pad provided within a portion of the backside region.

11. The apparatus of claim 10 wherein the semiconductor substrate is characterized by a thickness of about 600 microns to about 800 microns.

12. The apparatus of claim 10 wherein the surface region comprises a dielectric material.

13. The apparatus of claim 10 wherein the one or more MEMS devices are selected from a group consisting of: an accelerometer, a gyroscope, a magnetic sensor, a pressure sensor, a microphone, a humidity sensor, a temperature sensor, a chemical sensor, a biosensor, and an inertial sensor.

14. The apparatus of claim 10 wherein the surface region comprises the inner region, the first outer region, and the second outer region.

15. The apparatus of claim 10 wherein the second outer region is characterized by a width of about 100 microns and less, and wherein the first outer region is characterized by a width of about 200 microns and less.

16. The apparatus of claim 15 further comprising an opening provided between the enclosure housing and the one or more MEMS devices, and wherein the opening is filled with one or more gases.

17. An apparatus for packaging micro electro-mechanical systems (MEMS) and integrated circuits (ICs), the apparatus comprising:
a semiconductor substrate comprising one or more integrated circuits thereon, the semiconductor substrate having a surface region, the surface region comprising an inner region and a first outer region;
one or more MEMS devices overlying the inner region of the surface region;
an enclosure housing the one or more MEMS devices and configured overlying the first outer region of the surface region; and
one or more bonding structures provided through a thickness of the enclosure housing and configured overlying the first outer region, each of the bonding structures having a first bonding pad within a vicinity of the first outer region, a via structure, and a second bonding pad provided within a portion of an upper cover region of the enclosure housing.

18. The apparatus of claim 17 wherein the semiconductor substrate is characterized by a thickness of about 600 microns to about 800 microns.

19. The apparatus of claim 17 wherein the semiconductor substrate is characterized by a thickness of about 100 microns and less.

20. The apparatus of claim 17 wherein the surface region comprises a dielectric material.

21. The apparatus of claim 17 wherein the one or more MEMS devices are selected from a group consisting of: an accelerometer, a gyroscope, a magnetic sensor, a pressure sensor, a microphone, a humidity sensor, a temperature sensor, a chemical sensor, a biosensor, and an inertial sensor.

22. The apparatus of claim 17 wherein the surface region comprises the inner region and the first outer region, and wherein the first outer region is characterized by a width of about 200 microns and less.

23. The apparatus of claim 17 further comprising an opening provided between the enclosure housing and the one or more MEMS devices, wherein the opening is filled with one or more gases.

* * * * *